US010402511B2

(12) United States Patent
Farahat et al.

(10) Patent No.: US 10,402,511 B2
(45) Date of Patent: Sep. 3, 2019

(54) SYSTEM FOR MAINTENANCE RECOMMENDATION BASED ON PERFORMANCE DEGRADATION MODELING AND MONITORING

(71) Applicant: HITACHI, LTD., Chiyoda-ku (JP)

(72) Inventors: Ahmed Khairy Farahat, Santa Clara, CA (US); Chetan Gupta, San Mateo, CA (US)

(73) Assignee: HITACHI, LTD., Tokyo (JP)

( * ) Notice: Subject to any disclaimer, the term of this patent is extended or adjusted under 35 U.S.C. 154(b) by 510 days.

(21) Appl. No.: 14/970,149

(22) Filed: Dec. 15, 2015

(65) Prior Publication Data

US 2017/0169143 A1 Jun. 15, 2017

(51) Int. Cl.

| | |
|---|---|
| ***G06Q 10/04*** | (2012.01) |
| ***G06F 17/50*** | (2006.01) |
| ***G06F 17/18*** | (2006.01) |
| ***G06Q 10/06*** | (2012.01) |
| ***G06Q 10/00*** | (2012.01) |

(52) U.S. Cl.
CPC .......... *G06F 17/5009* (2013.01); *G06F 17/18* (2013.01); *G06Q 10/06393* (2013.01); *G06Q 10/20* (2013.01)

(58) Field of Classification Search
CPC ............................ G06F 17/5009; G06F 17/18
See application file for complete search history.

(56) References Cited

U.S. PATENT DOCUMENTS

| | | | | |
|---|---|---|---|---|
| 2004/0098358 A1* | 5/2004 | Roediger | G06N 5/00 706/46 |
| 2006/0047419 A1* | 3/2006 | Diendorf | G01C 21/26 701/532 |
| 2008/0183786 A1* | 7/2008 | Shimizu | G06Q 10/06 708/250 |
| 2012/0259962 A1* | 10/2012 | Bose | H04L 41/50 709/223 |

FOREIGN PATENT DOCUMENTS

| | | |
|---|---|---|
| WO | WO-2013072232 A1 * | 5/2013 |
| WO | WO-2014056318 A1 * | 4/2014 |

OTHER PUBLICATIONS

Translation of WO 2014056318 (Year: 2014).*
Authors et. al.: "Key Process Indicators (KPIs) with automatically adapted limits", Dec. 2, 2013.*
Kim, M. et al., (2008) Design of a steady-state detector for fault detection and diagnosis of a residential air conditioner. International Journal of Refrigeration, 31(5), pp. 791-792.
Friedman J. et al., (2009) The elements of statistical learning: Data mining, inference and prediction. Spring Series in Statistics, pp. 208-209.

* cited by examiner

*Primary Examiner* — Brian W Wathen
*Assistant Examiner* — Abdou K Seye
(74) *Attorney, Agent, or Firm* — Procopio, Cory, Hargreaves & Savitch LLP

(57) ABSTRACT

Example implementations described herein are directed to predictive maintenance of equipment using data-driven performance degradation modelling and monitoring. Example implementations described herein detect degradation in performance over a period of time, and alert the user when degradation occurs. Through the example implementations, the operator of equipment undergoing predictive mainte- (Continued)

nance modeling can determine a more optimized time in repairing or replacing the equipment or its components.

17 Claims, 13 Drawing Sheets

SYSTEM FOR MAINTENANCE RECOMMENDATION BASED ON PERFORMANCE DEGRADATION MODELING AND MONITORING

BACKGROUND

Field

The present disclosure is generally related to computer systems, and more specifically, to application of data analytics to provide maintenance recommendations.

Related Art

Maintenance is a process with an objective of keeping the equipment in a working, efficient and cost-effective condition. The maintenance process is conducted by performing the necessary actions on the equipment to achieve one or more of these objectives. These actions include, but are not limited to, the inspection, tuning, repair and overhaul of the equipment or its components. Equipment maintenance can be conducted in one of the following strategies:

(a) Corrective Maintenance: Corrective maintenance involves taking corrective actions after the equipment or one of its components fails in order to retain its working status. As this strategy waits for the equipment to fail before taking a maintenance action, corrective maintenance can result in decreasing the availability of the equipment. In addition, performing corrective actions after the occurrence of equipment failure may be more expensive and time-consuming.

(b) Preventive maintenance (also known as time-based maintenance): Preventive maintenance involves performing maintenance actions on a regular basis regardless of the condition of the equipment. In related art systems, preventive maintenance may be the most commonly followed strategy for equipment maintenance. Preventive maintenance avoids the limitations of corrective maintenance by performing periodic maintenance actions (e.g., periodic replacement of parts). However, preventive maintenance can be very expensive as most of the periodic maintenance actions are done while the equipment is in a good condition. Such maintenance could have been avoided if the actual condition of the equipment is known while planning for maintenance. Moreover, the equipment is still prone to unexpected failures that might happen due to abnormal usage patterns or environmental conditions between maintenance actions.

(c) Predictive Maintenance (also known as condition-based maintenance): Predictive maintenance can involve continually monitoring the condition of the equipment to determine the maintenance actions need to be taken at certain times. Predictive maintenance can reduce the chance of unexpected failures, increase the equipment availability, and accordingly decrease the overall cost of the maintenance process.

SUMMARY

The present disclosure involves a system for predictive maintenance of equipment using data-driven performance degradation modelling and monitoring. Example implementations of the present disclosure detect degradation in performance over a long period of time (e.g., months or years), and alert the user when degradation occurs. Example implementations differ from anomaly detection which detects abrupt changes in raw signals over a short period of time.

The present disclosure presents a system for predictive maintenance using performance degradation modeling and monitoring. The users of the example implementations of the present disclosure can include, but are not limited to equipment end-users and/or operators, maintenance personnel and management, data analysts and decision-support personnel, decision makers and operation managers, and equipment designers and manufacturers. The example implementations of the present disclosure can be utilized to gain insight into the current condition of the equipment as well as its individual components, early detect pre-failure conditions as well as inefficient and cost-ineffective operations of the equipment, save money and labor by planning ahead for maintenance actions as needed, avoid unexpected failures and increase equipment availability, eliminate unnecessary maintenance actions, and accordingly save parts and labor cost, and optimize cost and manpower for the maintenance process, by gaining insights into the actual components that require maintenance.

Example implementations of the present disclosure can be used as a standalone solution or be integrated with existing systems that provide other functionalities for predictive maintenance. The individual modules of the present disclosure can also be integrated as a module in other functionalities for predictive maintenance such as anomaly detection and event prediction.

Aspects of the present disclosure include a method, which may involve deriving an ideal density function for a first key performance indicator (KPI) value of an apparatus, based on historical sensor data of the apparatus; and deriving a first model relating a first KPI value to a load of the apparatus based on the historical sensor data of the apparatus. For the apparatus providing sensor data, the method may also involve deriving a second KPI value from the sensor data of the apparatus corresponding to the first KPI value; normalizing the second KPI value based on the first model and a present load to the apparatus; deriving a density function on the normalized second KPI value; and for a cumulative probability of the second KPI value falling above a threshold value determined based on the ideal density function of the first KPI, provide a maintenance alert based on the threshold value.

Aspects of the present disclosure include a non-transitory computer readable medium storing instructions for executing a process. The instructions may involve deriving an ideal density function for a first key performance indicator (KPI) value of an apparatus, based on historical sensor data of the apparatus; and deriving a first model relating a first KPI value to a load of the apparatus based on the historical sensor data of the apparatus. For the apparatus providing sensor data, the instructions may also involve deriving a second KPI value from the sensor data of the apparatus corresponding to the first KPI value; normalizing the second KPI value based on the first model and a present load to the apparatus; deriving a density function on the normalized second KPI value; and for a cumulative probability of the second KPI value falling above a threshold value determined based on the ideal density function of the first KPI, provide a maintenance alert based on the threshold value.

Aspects of the present disclosure may further include a computing device communicatively coupled to a plurality of sensors of an apparatus. The computing device may involve a memory configured to store historical sensor data of the apparatus; and a processor, configured to derive an ideal density function for a first key performance indicator (KPI) value of the apparatus, based on the historical sensor data of the apparatus; and derive a first model relating a first KPI value to a load of the apparatus based on the historical sensor data of the apparatus. For the apparatus providing sensor data, the computing device may further be configured to derive a second KPI value from the sensor data of the apparatus corresponding to the first KPI value; normalize the second KPI value based on the first model and a present load to the apparatus; derive a density function on the normalized second KPI value; and for a cumulative probability of the second KPI value falling above a threshold value determined based on the ideal density function of the first KPI, provide a maintenance alert based on the threshold value.

BRIEF DESCRIPTION OF DRAWINGS

FIG. 2(*b*) illustrates a flow diagram for the data cleaning process, in accordance with an example implementation.

FIG. 2(*c*) illustrates an example flow diagram for the operation mode detector submodule, in accordance with an example implementation.

FIG. 2(*d*) illustrates a flow diagram for a stable mode detector submodule, in accordance with an example implementation.

DETAILED DESCRIPTION

Figure 1:
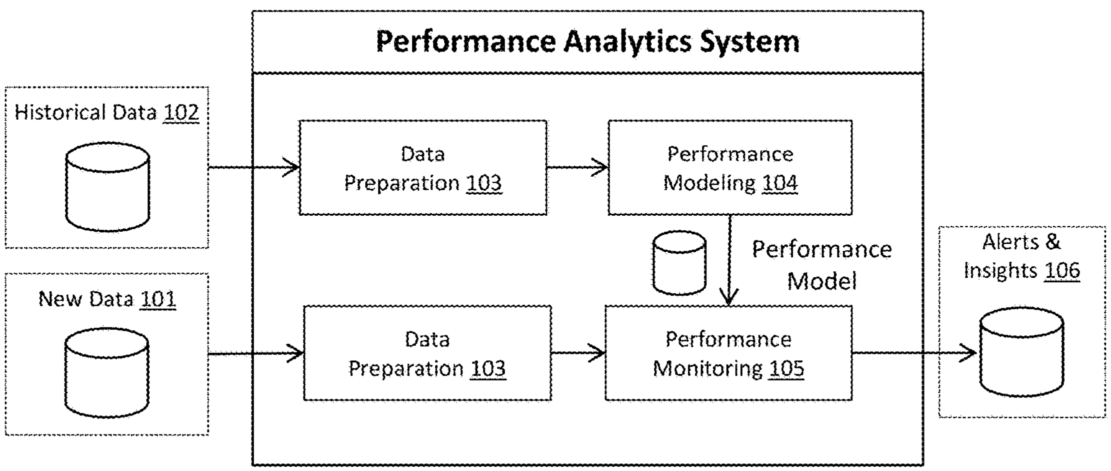
FIG. 1 illustrates an example data flow diagram for the performance analytics system, in accordance with an example implementation.
Figure 2A:
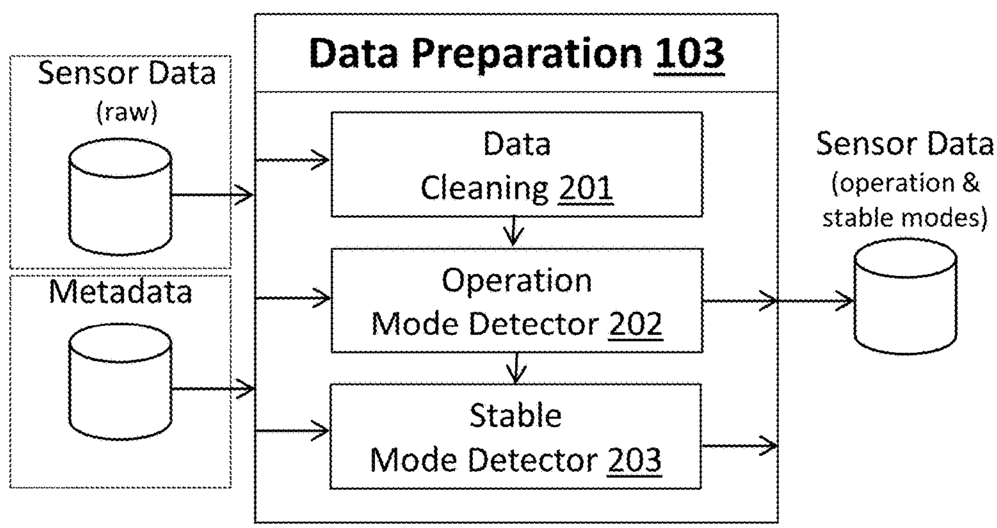
FIG. 2(*a*) illustrates a data preparation module, in accordance with an example implementation.
Figure 2B:
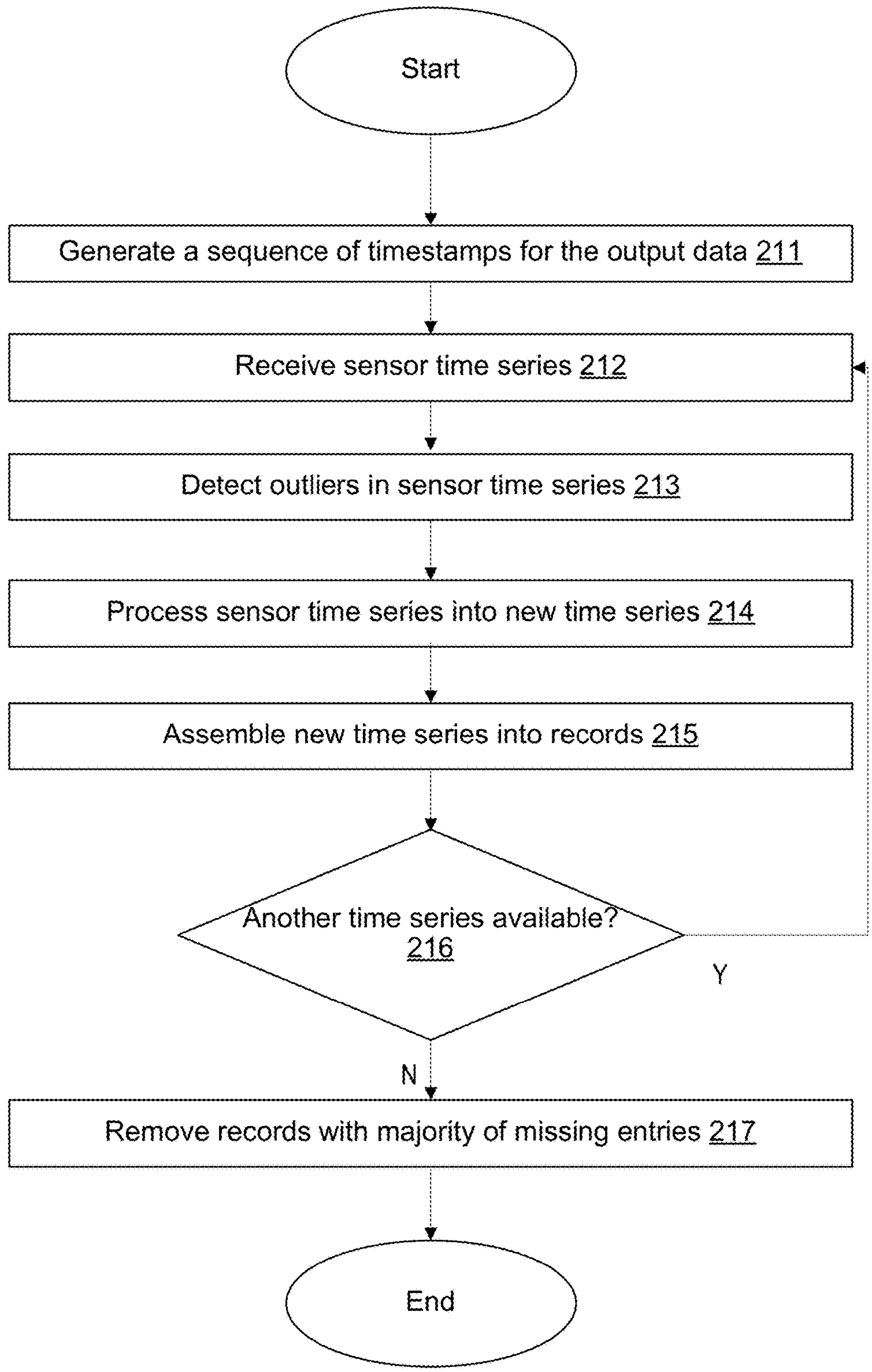
Figure 2C:
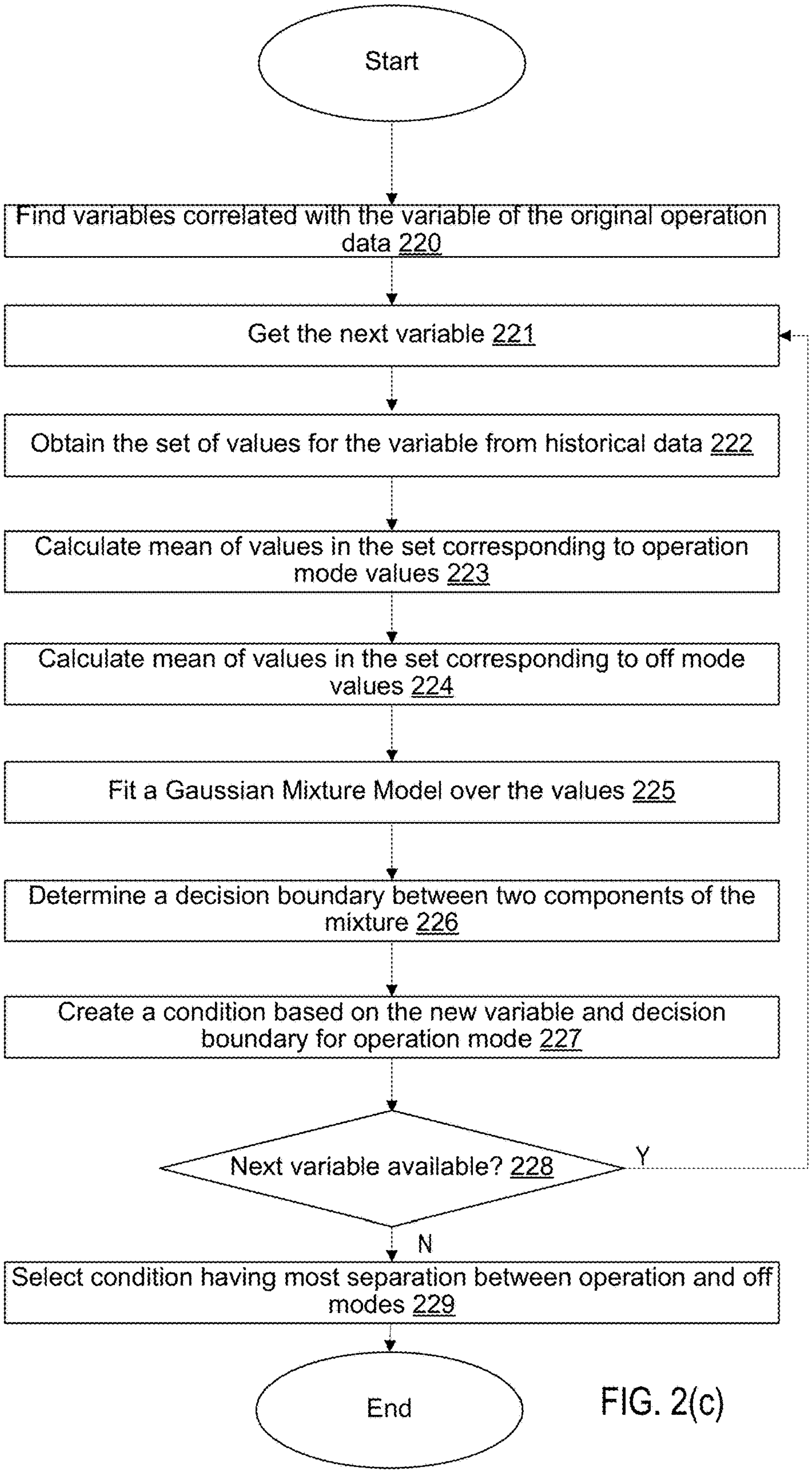
Figure 2D:
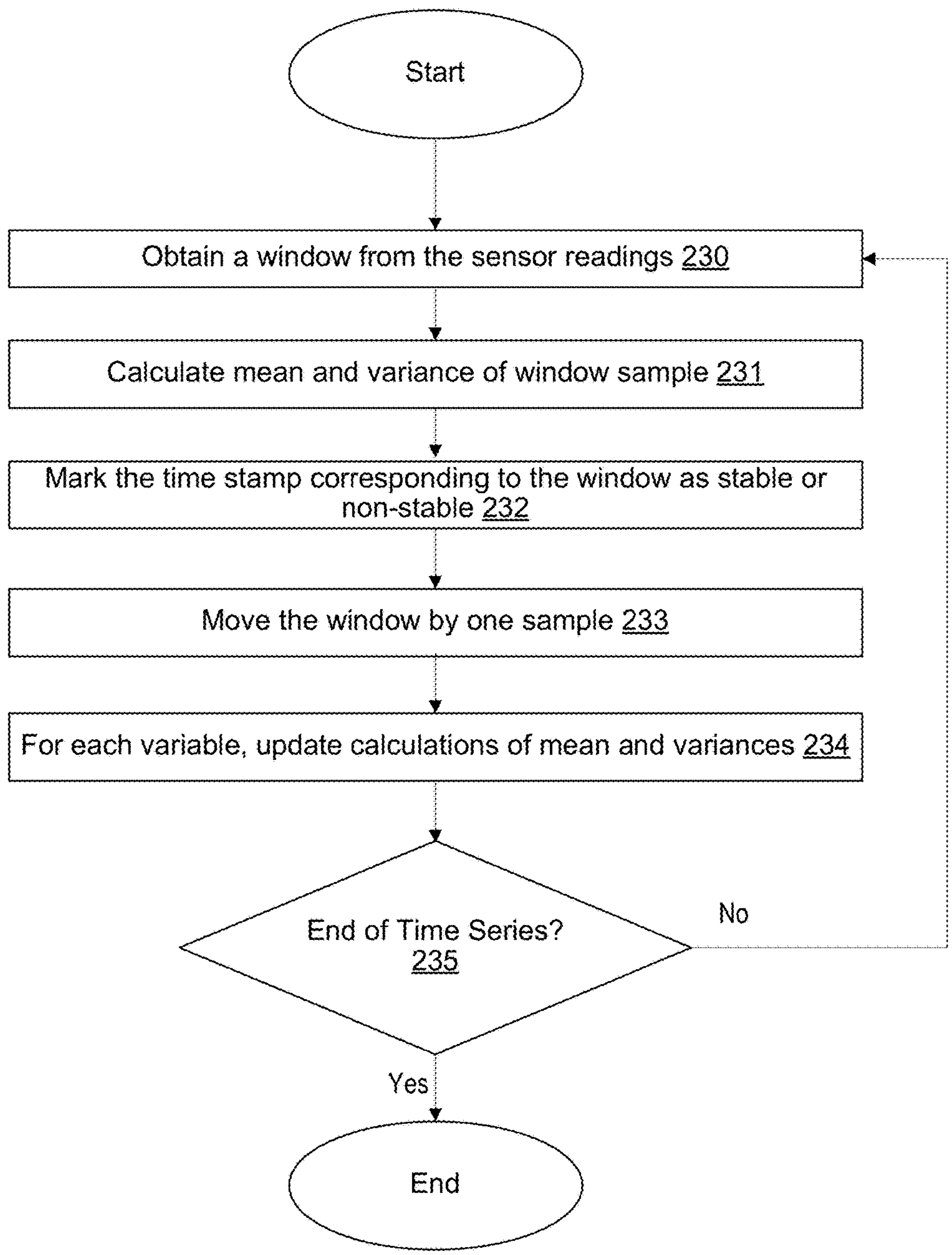

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application.

Predictive maintenance approaches can depend on encoding information about pre-failure conditions of the equipment and then monitoring real-time sensor and event data searching for these conditions. The information about pre-failure conditions can be: (a) rule-based (e.g., "$C_1$<10, and $B_4$>1000 for more than 10 hours") or (b) model-based (e.g., "a simulation of the normal behavior of the equipment"). Based on how this information can be obtained, predictive maintenance approaches can be classified into:

(a) Knowledge-driven approaches: In knowledge-driven approaches, information about pre-failure conditions (rules or models) is manually encoded by the equipment manufacturer or other experts in the equipment domain. Knowledge-driven approaches may be limited to the knowledge of domain experts about possible patterns of pre-failure conditions. For complex equipment, the actual behavior of the equipment can oftentimes be different from any simulation models or pre-defined rules.

(b) Data-driven approaches: In data-driven approaches, information about pre-failure conditions (rules or models) is learned from historical sensor data and event logs. One category of data-driven approaches depends on classification techniques to learn complex rules for failure detection from examples of failures that happened in the past. This category is supervised and requires the availability of sufficient examples of failures, which can be impractical for many types of equipment (e.g., aircrafts). A second category of approaches learns models of normal behaviors from historical data, and then detects any deviation from this normal behavior. This category is unsupervised as it does not require any examples of failures and accordingly is easier to develop. The example implementations may fall under the unsupervised category of data-driven approaches.

When learning behavior models from historical data, two distinct objectives can be achieved:

(a) Anomaly detection: Anomaly detection involves the detection of any abnormal behavior that happens during the operation of the equipment over a short time span (e.g., a few hours or days). Such anomalous behavior can involve a pre-failure condition that is flagged to be inspected by the maintenance staff, or an unusual condition in the equipment environment. These types of models are usually learned using a relatively small amount of normal data. Moreover, having an anomalous behavior does not necessarily mean that there is degradation in the equipment performance. These types of abnormal behaviors might happen during the early life of the equipment. In addition, when an abnormal behavior corresponds to a pre-failure condition, the behavior may happen shortly before the failure and therefore the gap between the times at which the abnormal behavior is detected and the actual failure can be relatively short (e.g., a few hours or days).

(b) Performance degradation detection: Performance degradation detection involves detection of slow degradation in the performance of the equipment. Slow degradation can be an early warning for some failure, or can reflect inefficient or cost-ineffective situations that may need to be addressed. The performance degradation models are learned over long periods of historical date (e.g., months or years), and the detection of a performance degradation requires the inspection of a relatively long time span (e.g., many days or even a few months). A continuous monitoring of performance degradation may result in an early enough warning for the maintenance staff to take actions to prevent a failure or restore the equipment to an efficient and cost-effective state.

Example implementations described herein are directed to implementations of performance degradation detection. Specifically, example implementations involve a systematic approach for performance analytics that detects degradation in equipment performance using sensor measurements from the equipment. In comparison to related art implementations on performance degradation modeling, example implementations of the present disclosure are directed to use by domain experts, rather than data scientists/analysts. Once linked to sensor data sources, the example implementations improve on the related art by only requiring the domain expert to define domain-level conditions for equipment operation, and performance indicators to start performance monitoring and analytics. Example implementations involve a probabilistic model for ideal performance from historical data and monitor recent and cumulative values of key performance indicators to detect deviation from the ideal performance.

FIG. 1 illustrates an example data flow diagram for the performance analytics system, in accordance with an example implementation. Example implementations of the present disclosure are configured to receive the following formats of input data:

(a) Sensor Data: Sensor data can involve streaming (e.g. new data 101) and historical time series data 102 collected from different sensors measuring desired metrics of components or other aspects of an apparatus. Each time series represent the readings of the sensor value every k minutes, where k can depends on the frequency by which data can be retrieved from a given sensor. The sampling rate k can have different values for different sensors. Each sensor reading is associated with a timestamp that specifies the date and time of the reading. The data can be collected from the sensor in batches, where each batch of data represents the sensor readings for a few days. Other time periods are possible depending on the desired implementation (e.g. a few hours). There might be gaps between batches. The gaps can be due to data being received late at the monitoring facilities, or data discarded by the equipment and not received at all. For instance, an example implementation to reduce communication may send data for two day batches every five days and discard the rest. The data collection frequency can also differ from one sensor to another.

(b) Event data: Event data involves discrete events that are relevant to the equipment domain. Event data describes events that happened in the environment of the equipment. Such event data can include, but is not limited to, events that are parts of the equipment operation (e.g., start of operation), maintenance and check-up actions that were conducted on the equipment (e.g., part replacement, overhaul), external actions in the environment of the equipment (e.g., blackout, heat wave). Each event is associated with a time-stamp that specifies the date and, depending on the desired implementation, the time of the event. Event data can also be provided as streaming data (new data 101) or historical data 102.

(c) Metadata: Metadata involves data that describe extra information about the characteristic of the equipment and environment in which the equipment is installed. Such metadata can include, but is not limited to, the specifications of the equipment, operation conditions (e.g., operation hours), environment conditions (e.g., location, temperature, humidity), the installation information (e.g., date), and maintenance records (e.g., date, conditions, notes). All these data can appear in structured, semi-structured or unstructured formats, and can be incorporated with streaming data (new data 101) or historical data 102.

The received data can be processed through a series of modules of the system architecture, according to the desired implementation. Example implementations of the modules can include the data preparation module 103, which is configured to prepare the raw sensor data by removing noise and identifying the subset of sensor data that can be utilized for further analysis. Further detail of the data preparation module 103 is provided in FIG. 2(*a*). The performance modeling module 104 is configured to mine historical sensor data (e.g. sensor data obtained in the past measuring desired metrics of sensors monitoring components or other aspects of an apparatus) and build performance models to quantify the performance of the equipment and its components. Further detail of the performance modeling module 104 is provided in FIG. 5. The performance monitoring module 105 is configured to monitor new sensor data and detect performance degradation in the equipment or any of its components. Further detail of the performance monitoring module 105 is provided in FIG. 8. Performance monitoring provides information utilized as alerts and insights to the system at 106.

FIG. 2(*a*) illustrates a data preparation module, in accordance with an example implementation. The data preparation module 103 is configured to receive as input historical/new sensor data along with metadata about the equipment, and can include the following processes. Data cleaning 201 is a process configured to consolidate data from different streams and remove noise and outliers from the data. Operation mode detector 202 is a process configured to detect the operation mode of the equipment from the sensor data. Stable mode detector 203 is a process configured to detect parts of the time series that correspond to a state where the condition of the equipment is stable (i.e., does not experience changes beyond a desired threshold in sensor readings). Information regarding the operation mode 202 and the stable mode 203 is output by the data cleaning 201 along with the sensor data. In other words, the sensor data can be augmented with information about the operation and stable mode.

FIG. 2(*b*) illustrates a flow diagram for the data cleaning process 201, in accordance with an example implementation. Sensor data can be collected from different data streams (e.g., equipment sensors and weather data). Each time series might have a different sampling rate and the data might arrive in batches of different sizes. The data cleaning process 201 is configured to consolidate data from different sources and obtain data in a format relating sensors to sensor readings and timestamps. An example format can include a tabular format whose columns represent the sensors and each row represents the sensor readings at a unique timestamp, but is not limited thereto. In such an example, the rows are referred to as data records. The data cleaning process can then proceed in accordance with the flow diagram.

At 211, the data cleaning process 201 is configured to generate a common sequence of timestamps for the output data. The common sequence can be generated based on a fixed gap (e.g., every 5 minutes) or using the timestamps of one of the sensors (e.g., the one with the largest number of readings), depending on the desired implementation.

At 212, the data cleaning process 201 receives a sensor time series. At 213, the data cleaning submodule 201 detects outliers in the sensor reading. When an outlier is detected, the data cleaning process 201 can either remove the outlier or replace the outlier with values calculated based on other readings of the same sensor.

At 214, the data cleaning process 201 conducts processing for a given sensor time series. The processing of the sensor time series includes detection of outliers in the sensor readings and either remove the outliers or replace the outliers with values calculated based on other readings of the same sensor (e.g., average or median of nearest neighbors).

The processing of the sensor time series may also include the estimation of the sensor values at each common timestamp by interpolating the readings of the sensor time series at nearby timestamps. The estimation can be conducted by learning a regression model for the original time series and finding the values of regression function at the common timestamps, or by other methods depending on the desired implementations.

At 215, the data cleaning process 201 assembles the new sensor time series into records. At 216, the data cleaning process 201 performs a check to determine if there is another sensor time series for processing. If so (Yes), then the flow proceeds back to 212, otherwise (No), the flow proceeds to 217 wherein the flow removes records having a majority of missing entries, and the sensor data is provided.

Table 1 below illustrates a sample output of the data cleaning process, in accordance with an example implementation.

TABLE 1

Sensor data after data cleaning

| Time stamp | Sensor #1 | . . . . | Sensor #m |
|---|---|---|---|
| 2015/05/01 9:10:00 AM | 10 | . . . . | 700 |
| 2015/05/01 9:15:00 AM | 11 | . . . . | 710 |
| 2015/05/01 9:20:00 AM | 11 | . . . . | 712 |
| 2015/05/01 9:25:00 AM | 12 | . . . . | 710 |
| 2015/05/01 9:30:00 AM | 11 | . . . . | 710 |
| 2015/05/01 9:35:00 AM | 10 | . . . . | 710 |
| . . . . | . . . . | . . . . | . . . . |

FIG. 2(*c*) illustrates an example flow diagram for the operation mode detector process 202, in accordance with an example implementation. The operation mode detector process 202 is configured to identify the periods during which the equipment is being operated. These periods are referred to as the "operation" mode. The periods during which the equipment is not being operated are referred to as the "off" mode. Information about the operation mode is represented in the metadata as conditions over sensor data (e.g., current >100 and temperature >40). These conditions are typically defined by the domain experts from the specifications given by the equipment manufacturer, and most of the time they do not accurately reflect the actual operation conditions of the equipment. In addition, the sensors included in these conditions might be noisy. This results in misidentifying periods during which the equipment is being operated. In order to avoid these limitations, example implementations utilize historical data to learn more accurate conditions for the operation mode.

Figure 3:
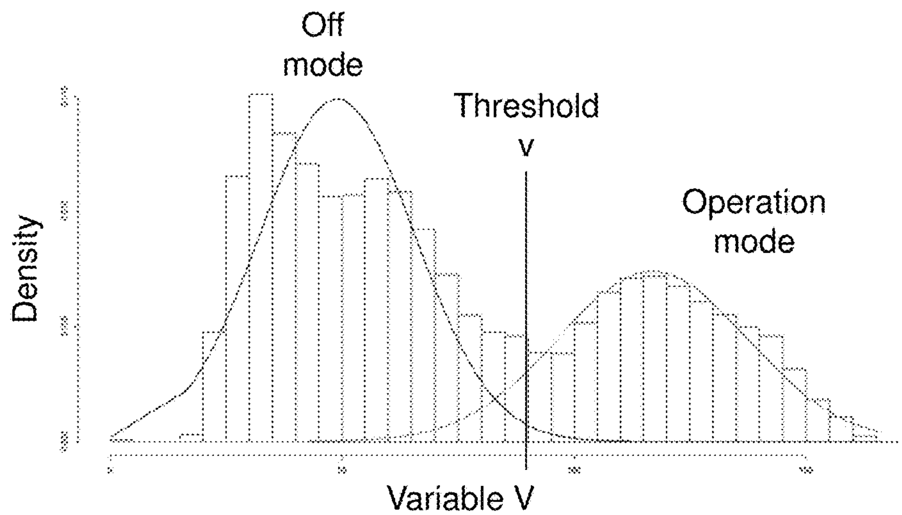
FIG. 3 shows an example of a GMM learned over historical sensor data of a variable correlated with the original variable specified in the metadata, through the flow diagram of FIG. 2(*c*).

Let "A≥a" be a condition defined by the domain expert for the operation mode, where "A" is a variable that corresponds to some sensor and "a" is a threshold value (A condition in the form of A≤a can be transformed to A'≥a' without loss of generality). The operation mode detector proceeds as follow:

At 220, the operation mode detector process 202 find variables "$\{B_1, \ldots B_r\}$" that have strong correlation with "A". Correlation can be defined by the domain expert based on the physical model of the equipment or learned using data-driven measures, or through other methods in accordance with the desired implementation. At 221, the operation mode detector process 202 processes each variable $V \in \{A, B_1 \ldots B_r\}$ from the original variable and variables identified at 220. At 222, the operation mode detector process 202 obtains the values of "V" from historical data. At 223, the operation mode detector process 202 calculates $m_1$ as the mean of the values of "V" that correspond to "A≥a" (operation mode values). At 224, the operation mode detector process 202 calculates $m_2$ as the mean of the values of "V" that correspond to "A<a" (off mode values). At 225, the operation mode detector process 202 fits a Gaussian Mixture Model (GMM) with two components over the values of "V", by using an iterative algorithm such as Expectation Maximization (EM) with initial means for the two mixtures equal to $m_1$ and $m_2$, or by other methods in accordance with the desired implementation. At 226, the operation mode detector process 202 determines a decision boundary "v" between the two mixtures for which p(v∈"operation")>>p(v∈"off") At 227, the operation mode detector process 202 creates a new condition "V><=v" for "operation" mode (V≥v if $m_1>m_2$ or V≤v if $m_1<m_2$). At 228, if there are variables remaining for processing (Yes) then the flow reverts to 221 to process the next variable, otherwise (No) the flow proceeds to 229. At 229, the operation mode detector process 202 selects the condition "V><=v" which has the most separation between "operation" and "off" components. FIG. 3 shows an example of a GMM learned over historical sensor data of a variable correlated with the original variable specified in the metadata, through the flow diagram of FIG. 2(*c*).

FIG. 2(*d*) illustrates a flow diagram for a stable mode detector process 203, in accordance with an example implementation. When the equipment status changes from one mode to another (e.g., "off" to "operation" or vice versa), the raw signals from the sensors may experience high fluctuations shortly after the change. During these fluctuations, it may be difficult to obtain information about the relations between different signals. For instance, if the readings of sensor "A" reflect the changes in the readings of sensor "B", there may be a delay between the time at which sensor "A" and that at which "B" changes, and the data right after the transition of "B" should not be used to judge on the relation between the two signals. To avoid this problem, example implementations utilize a moving window to filter-out periods of the time series that experience large variances in the signals of interest. Given a set of sensor variables and the corresponding thresholds on the variances of these variables $O'_1, \ldots O'_m$, the $V_1, \ldots V_m$ algorithm for stable mode detector submodule 203 executes the following flow diagram.

At 230, the stable mode detector process 203 starts at the entry corresponding to the first timestamp, and obtains the sensor readings in a window of size "w" samples. At 231, for each variable "$V_i$", the stable mode detector process 203 calculates the mean and variance of the samples for this variable $\{v_i^{(t)}, v_i^{(t-1)}, \ldots v_i^{(t-w)}\}$. At 232, the stable mode detector process 203 marks the timestamp at the end of the window as stable if $\mathrm{var}(v_i^{(t)}, v_i^{(t-1)}, \ldots v_i^{(t-w)}) \leq O'_i$ for all variables. At 233, the stable mode detector process 203 moves the window by one sample (e.g. remove the first sample and add the "w+1"-th sample). At 234, for each variable "V", the stable mode detector process 203 updates the calculations of the mean and variances using recursive formulas. At 235, the stable mode detector process 203 checks if the end of the time series is reached. If so (Yes), then the flow ends. If not (No), then the flow proceeds back to 230.

Figure 4:
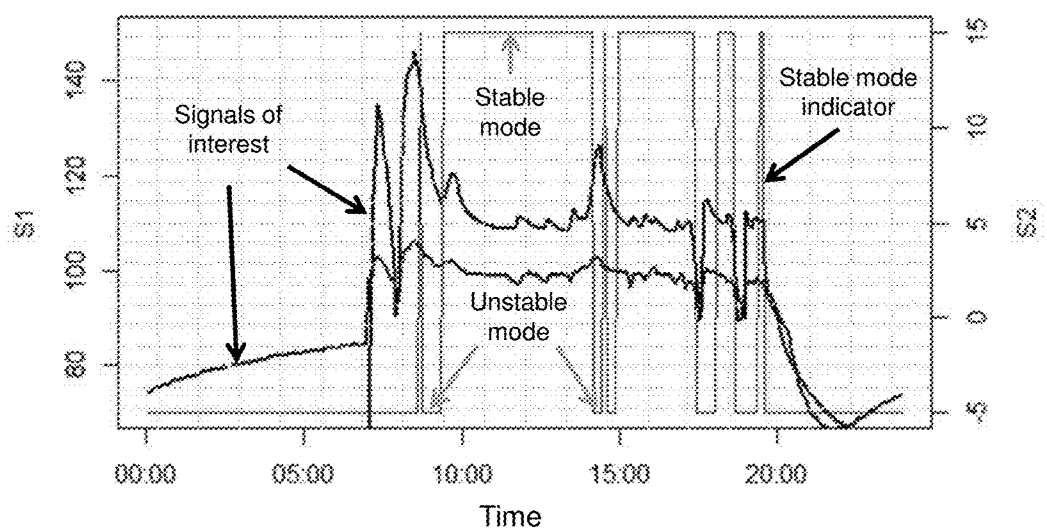
FIG. 4 illustrates an example of how the stable mode detector is applied to multiple signals, through the flow diagram of FIG. 2(*d*).

The thresholds can be tuned using a few examples from stable and non-stable modes, or by other methods in accordance with the desired implementation. FIG. 4 illustrates an example of how the stable mode detector is applied to multiple signals, through the flow diagram of FIG. 2(*d*).

Figure 5:
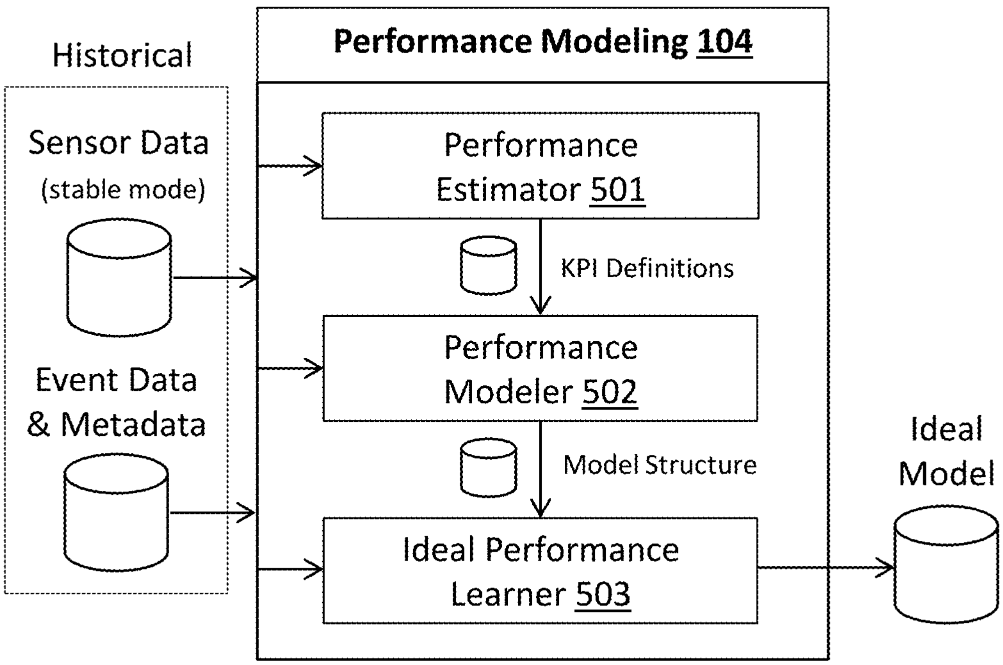
FIG. 5 illustrates a flow diagram of the performance modeling process, in accordance with an example implementation.

FIG. 5 illustrates a flow diagram of the performance modeling module, in accordance with an example implementation. The performance modeling module 104 builds a model for the performance of equipment from the historical sensor data. The performance modeling module 104 may involve the following processes. The performance estimator process 501 is configured to define Key Performance Indicators (KPI) that reflects the performance of equipment from raw sensors data. The performance modeler process 502 is configured to define a performance model based on the KPI values. The performance model can be used to represent performance change over time. The ideal performance learner process 503 is configured to learn from the data the parameters of the model during the ideal performance periods.

The performance estimator process 501 takes as input the sensor data during the stable mode and outputs a set of Key Performance Indicators (KPI) that quantify the overall performance of the equipment as well as its individual components. Information about the performance of the equipment can be obtained in the form of formulas in the metadata as well as high level description from the domain experts (e.g., the equipment should cool down faster when the fan is turned on at the maximum speed). In order to estimate the performance of the equipment, example implementations use the relations derived from the metadata and the domain knowledge and define a KPI for each component as well as the overall performance of the equipment. At time t, each KPI is defined as:

$$\mathrm{KPI}(t)=f(V_1(t), \ldots V_m(t)),$$

Where $f$ is a function of the values of sensor variables $V_1, \ldots V_m$ at time t. Without loss of generality, it can be assumed that higher values for KPI reflect better performance. The KPI value at time t is calculated for a set of values for the corresponding time series of $V_1, \ldots V_m$. This results in a new time series for each KPI. The KPI time series are calculated for historical and new data and stored in a storage medium for further analysis.

The performance modeler process 502 is configured to treat each KPI as a random variable and model the performance of the equipment or its components as the probability density function of the KPI:

$$p(v, T)=P(V_T=v)$$

where T is a given period of time, $V_T$ is a random variable that represents the KPI during period T, and p(v, T) is the probability that $V_T$ is equal to v. The use of density functions to model performance reflects the fact that the performance of the equipment is not monotonically decreasing from the day of installation until it breaks down. In reality, new equipment might experience short bursts of very bad performance during its normal operation (e.g. due to harsh operation conditions), but this very bad performance will not be dominant for a new piece of equipment. On the other hand, very old equipment might still perform very well under mild operation conditions. However, this very good performance will not be that dominant when the equipment is old. This means that the probability of having a high KPI will be high during the first years of installation, and this probability will decreases over time as the performance of the equipment is degrading.

The probability density function p(v, T) can be learned from the historical KPI values during period T using density estimation techniques. These techniques include parametric methods which assume some distribution (e.g., Gaussian) for the KPI values and learn the parameters of this distribution from the data, and non-parametric methods which make no assumption about the distribution of the KPI values such as kernel density estimation. Other techniques may also be utilized depending on the desired implementation.

When the KPI goes below a certain value, performance degradation is detected and reported to the maintenance staff. In order to quantify this degradation, example implementations utilize the cumulative density function which represents the probability that the KPI is below a certain value. The cumulative density function is defined as:

$$F(v, T)=P(V_T \leq v)$$

where T is a given period of time, $V_T$ is a random variable that represents the KPI during period T, and F(v, T) is the probability that $V_T$ is less than or equal to v. For a target performance level $v_i$, the higher the value of $F(v_i, T)$ the more severe is the performance degradation. The example implementations determine multiple levels $\{v_1, \ldots, v_l\}$ for which the performance is monitored. For a monitoring level $v_i$, the performance degradation over time is defined as:

$$F(v_i, T)=P(V_T \leq v_i)$$

Figure 6:
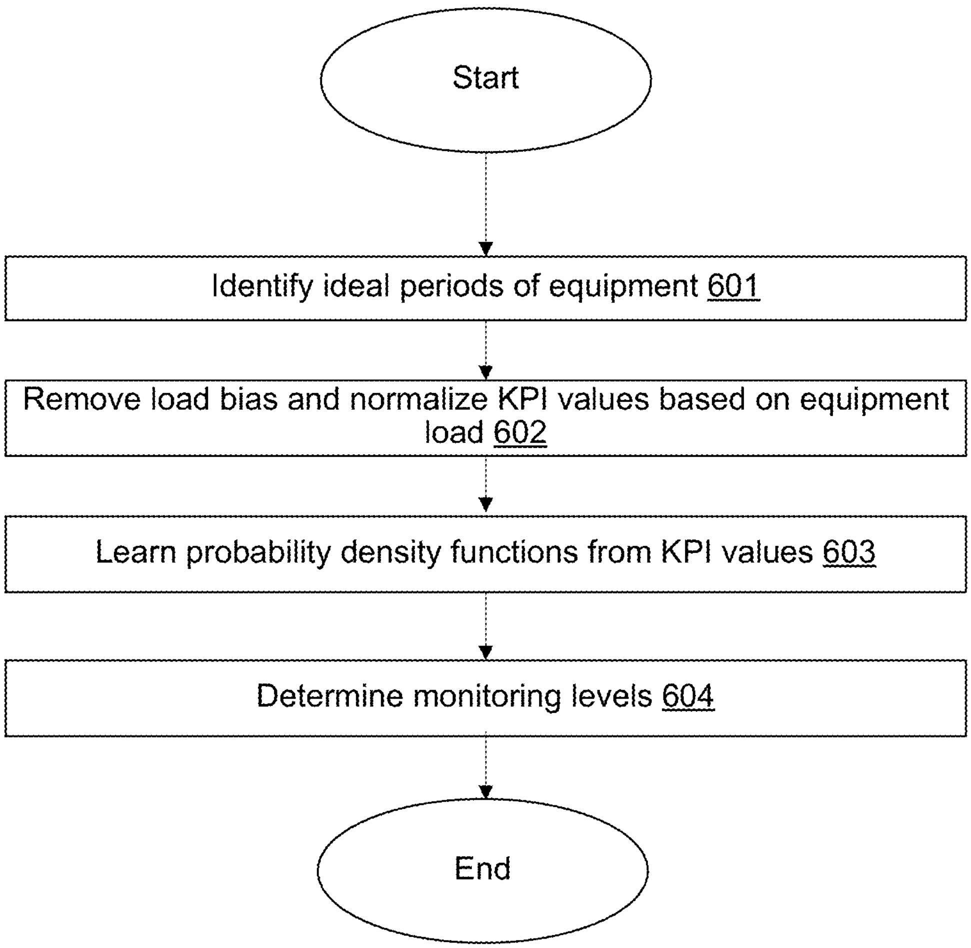
FIG. 6 illustrates a flow diagram of the ideal performance learner submodule 503, in accordance with an example implementation.

FIG. 6 illustrates a flow diagram of the ideal performance learner process 503, in accordance with an example implementation. In this phase, an ideal performance model is learned from historical data. Given historical sensor data and the corresponding KPI values, this learning phase can be derived from the following flows. At 601, the ideal performance learner process 503, is configured to identify ideal periods to determine the periods of time during which the equipment was performing ideally. These periods can correspond to the first few months of operation of the equipment. The event data and metadata are used to obtain this information and to avoid including periods in which there were installation or operation problems. At 602, the ideal performance learner process 503 is configured to remove load bias, to normalize the KPI values based on the load on the equipment. Further details of how load bias is removed are described below.

At 603, the ideal performance learner process 503 is configured to learn density functions, to learn the probability density functions from the KPI values that correspond to ideal periods $p(v, T_{ideal})=P(V_{Tideal}=v)$. Parametric or non-parametric methods can be used for this purpose. At 604, the ideal performance learner process 503 is configured to learn monitoring levels: which determines the KPI values $\{v_1, \ldots, v_l\}$ below which the performance degradation will be monitored during the online monitoring phase. For example, by specifying a monitoring level of 0.8, the system will monitor and report for each new period of measurements the probability of having KPI values below 0.8. As there are typically different categories of maintenance actions, the maintenance staff will require the monitoring of multiple performance levels for each KPI, with each level corresponding to one category of maintenance actions. For example, when the KPI values significantly go below 0.8 (but still mostly above 0.5), the maintenance staff will perform a minor maintenance action but when the KPI values significantly go below 0.5, they will performance a major maintenance action. Depending on the number of maintenance categories, multiple performance levels can be monitored. These monitoring levels can be directly specified by the maintenance staff in terms of KPI values $\{v_1, \ldots, v_l\}$ (e.g., monitor KPI values below 0.9, 0.8, and 0.5), or learned from the ideal data by specifying the values of cumulative probabilities in the ideal performance model $\{c_1, \ldots, c_l\}$ (e.g., monitor KPI values whose ideal cumulative probabilities are below 10%, 1% and 0.1%). Given these probabilities, the corresponding KPI values can be obtained from the performance model as:

$$v_i = \max(v) \text{ subject to } F(v, T_{ideal}) \le c_i$$

Figure 7:
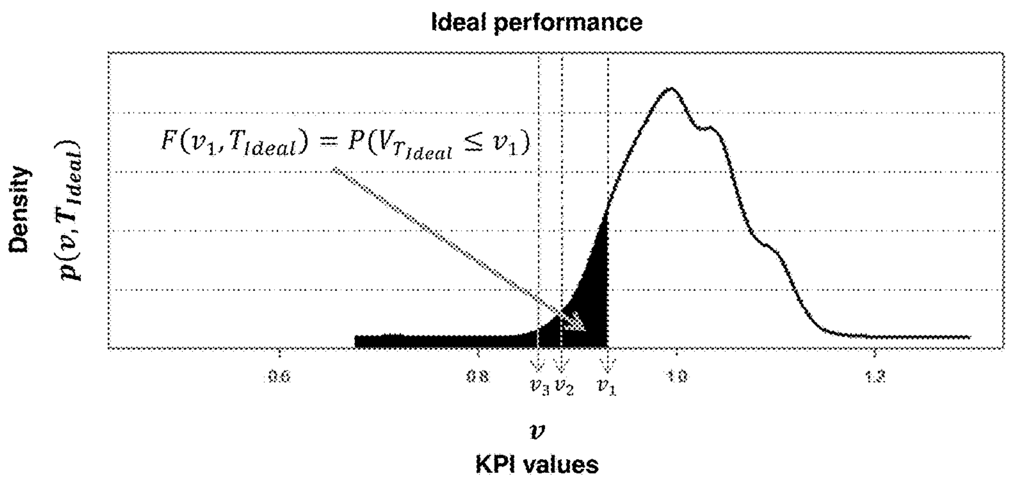
FIG. 7 illustrates a sample model for the ideal performance and the monitoring levels corresponding to $c_i$=10%, 1% and 0.1%.

FIG. 7 illustrates a sample model for the ideal performance and the monitoring levels corresponding to $c_i$=10%, 1% and 0.1%. Table 2 shows the corresponding KPI values learned from the ideal performance model.

TABLE 2

Sample monitoring levels learned from the ideal performance distribution

| Index i | Cumulative probabilities during ideal periods: $c_i = F(v, T_{ideal})$ | KPI monitoring level $v_i$ |
|---|---|---|
| 1 | 10% | 0.93 |
| 2 | 1% | 0.89 |
| 3 | 0.1% | 0.86 |

Thus from the example implementations described above, the system can monitor performance at desired levels (e.g., levels corresponding to cumulative probabilities of first KPI equal to 10%, 15%, etc.), and then generate an alert based on the desired threshold (e.g., alert when cumulative probability of second KPI is greater than 30%).

Figure 8:
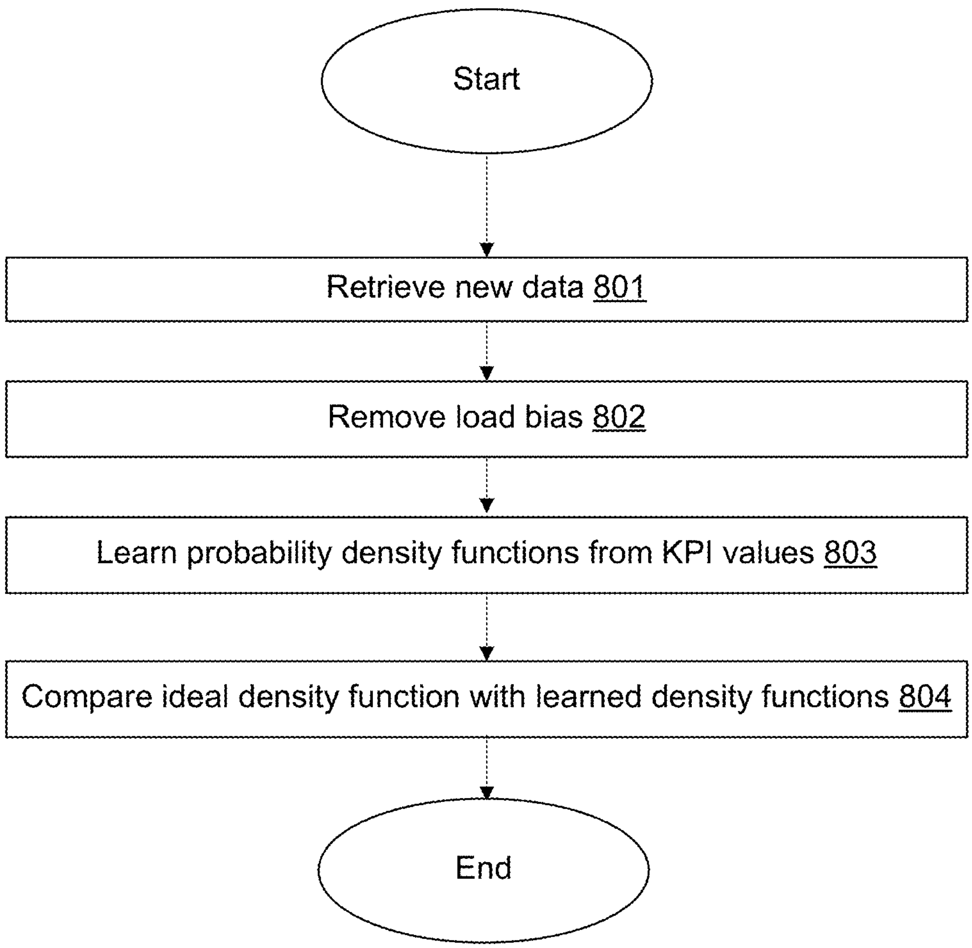
FIG. 8 illustrates a flow diagram for the performance monitoring module, in accordance with an example implementation.

FIG. 8 illustrates a flow diagram for the performance monitoring module 105, in accordance with an example implementation. The performance monitoring module 105 is concerned with the monitoring and detection of performance degradation for new sensor data. Given the new sensor data and the corresponding KPIs, the monitoring phase proceeds as follows.

At 801, the performance monitoring module 105 retrieves new data which can involve collecting new sensor data and KPIs. The data is collected in batches (e.g., every week). The frequency of data collection can be adjusted according to the nature of the equipment. At 802, the performance monitoring module 105 removes load bias to normalizes the new KPIs based on the load on the equipment. Details for removing load bias are provided below.

At 803, the performance monitoring module 105 learns the density functions, which can involve learning probability density functions from the KPI values that correspond to new periods. In example implementations, the performance monitoring module 105 learns two density functions for each batch of new data. Specifically, the performance monitoring module 105 learns the density function for new KPI values during the current batch. For instance, a density function is learned based on the KPI values during the last month of data. Monitoring this density function allows for detecting sudden degradation that happens recently in the equipment performance. This sudden degradation could be due to a malfunction in the equipment of the operation or an extreme environment condition. Ideally, these types of sudden degradations should be detected by anomaly detection modules which depend on the monitoring sensor data in real time. However, the anomaly detection technique may miss these degradations if the change in the sensor values spans a wider time window. In this case, monitoring density functions during the recent batch has a higher chance of detecting these changes.

The performance monitoring module 105 also learns the density function for cumulative KPI values collected since the installation of equipment. For instance, the density function at the fifth year will be learned based on the KPI values during the last five years including the ideal periods as well as the most recent batch of KPIs. When a new batch of the data arrives at the start of the sixth year, the new density function will be learned based on all the previous KPIs as well as the new KPIs. Monitoring this density function allows for capturing slow degradation of performance as the most recent batch might include an insignificant degradation in KPI but looking at a wider span of data will reveal that this degradation has been happening for some time, and there is an accumulating evidence to issue a warning to the user.

At 804, the performance monitoring module 105 compares with monitoring levels, which compares the ideal density function with the density functions learned from new data, and identifies if there is an increase in the probability $p(v, T_{New})$ for low values of the KPI. The flow at 804 creates a dashboard for the system users which displays the new cumulative density function $F(v_i, T_{New}) = P(V_{TNew} \le v_i)$ for each monitoring level $v_i$ determined during the learning phase. It also displays a warning if this cumulative probability goes above a warning threshold $w_i$:

$$\text{If } F(v_i, T_{New}) \ge w_i, \text{Alarm(Severity}=Fn(F(v_i, T_{New}), c_i))$$

The severity of the warning can be determined using the new cumulative probability $F(v_i, T_{New})$ for this monitoring level $v_i$ and the corresponding cumulative probability during the ideal performance $c_i$. The system user can assign a single or multiple warning thresholds for each monitoring level $\{w_1, \ldots, w_l\}$ and associate each warning threshold with maintenance actions that should be performed when the cumulative probability exceeds this threshold.

Figure 9:
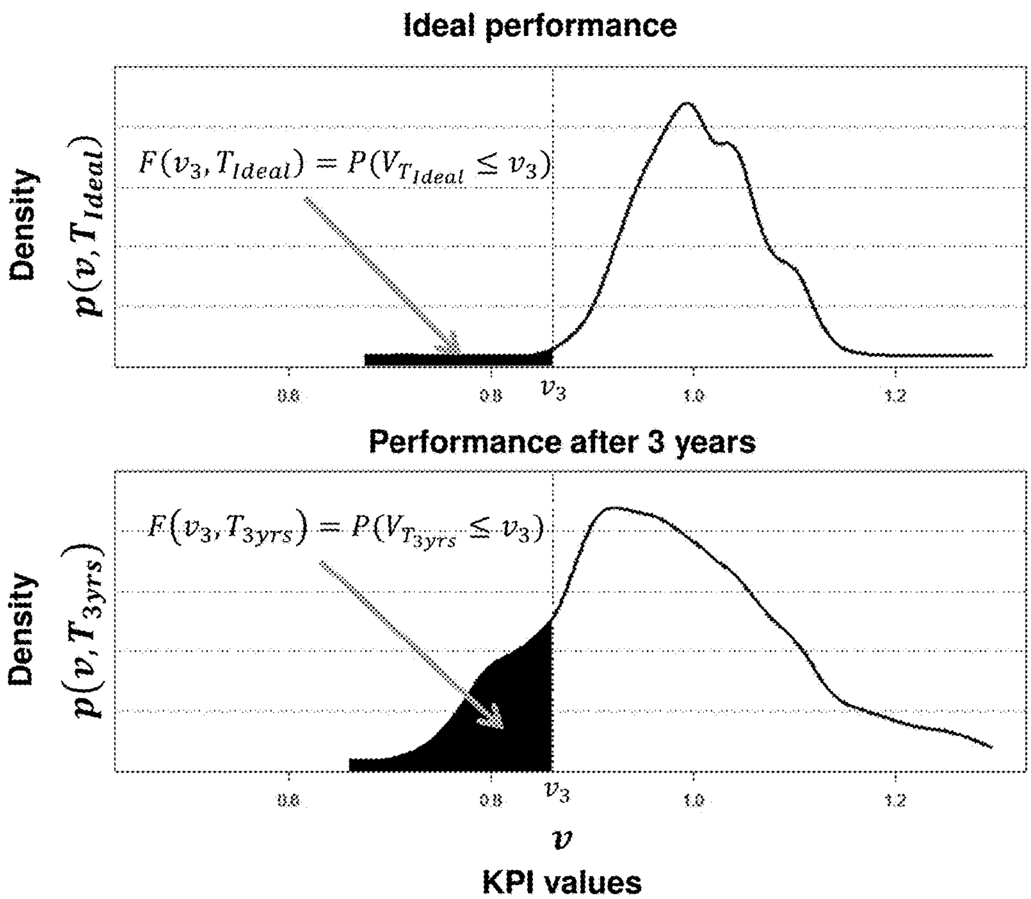
FIG. 9 illustrates examples of density functions for ideal and degraded performance, and the values of the cumulative density functions for one monitoring level.

FIG. 9 illustrates examples of density functions for ideal and degraded performance, and the values of the cumulative density functions for one monitoring level. Table 3 shows sample calculations of performance degradation at different monitoring levels for two monitoring periods. In this example, when using warning thresholds of 30% for all levels, the system will issue an alarm after 3 years for Level 1 and after 4 years for Levels 1 and 2. The maintenance staff will accordingly perform the maintenance actions to address the issued alarms.

TABLE 3

Sample calculations of performance degradation after 3 and 4 years with warning thresholds $w_1 = w_2 = w_3 = 30\%$

| Index i | Ideal performance: $c_i = F(v_i, T_{ideal})$ | KPI monitoring level $v_i$ | Performance degradation after 3 years $F(v_i, T_{3yrs})$ | Performance degradation after 4 years $F(v_i, T_{4yrs})$ |
|---|---|---|---|---|
| 1 | 10% | 0.93 | 37.9% (ALARM) | 45.2% (ALARM) |
| 2 | 1% | 0.89 | 21.7% | 30.9% (ALARM) |
| 3 | 0.1% | 0.86 | 16.3% | 26.2% |

One part of the flow in the two phases of performance analytics is the removal of the load bias 802. The removal of load bias can be needed as there may be a tendency of performance to be dependent on the load of the equipment. When the load on the equipment is low, the KPI values tend to be higher than the KPI values corresponding to higher load. This reflects the fact that equipment performs relatively better under low load. In order to remove this bias, the example implementations implement the removal of load bias 802 as follows.

For the KPI values over idle periods, learn a function h(l) that estimates the KPI for load l. This function can be learned using linear or non-linear regression techniques depending on how the KPI changes with respect to the load, or by other techniques depending on the desired implementation.

For each new KPI value at time t, normalize the KPI value with the value of h(l) for the corresponding load value l at time t:

$$KPI(t)=N(KPI(t),h(l(t)))$$

Where N(a, b) is a function that normalizes a using b. Possible instances of N are division N(a, b)=a/b and subtraction N(a, b)=a−b When load bias removal is applied in the ideal performance learner submodule 503, this results in a normalizing the KPI values during the idea periods to be distributed around N(a, a) (e.g., 1 for division and 0 for subtraction).

Figure 10:
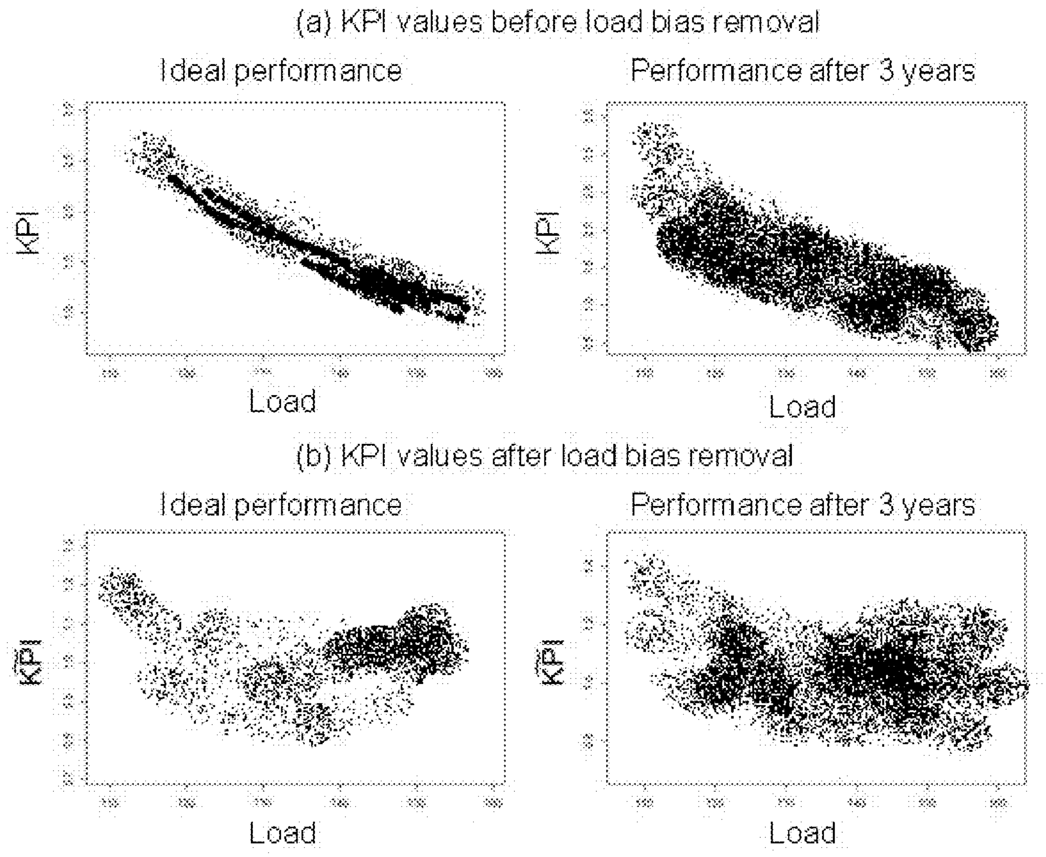
FIG. 10 illustrates the load bias removal process for a sample KPI using N(a, b)=a/b.

The definition of load differs from one equipment to another. The load value may directly correspond to one of the sensor values or it can be a function over multiple sensors. The metadata about the equipment is used to get a definition of the load from the sensor data. After the load value is obtained for each timestamp, the aforementioned procedure can be applied. FIG. 10 illustrates the load bias removal process for a sample KPI using N(a, b)=a/b.

Figure 11:
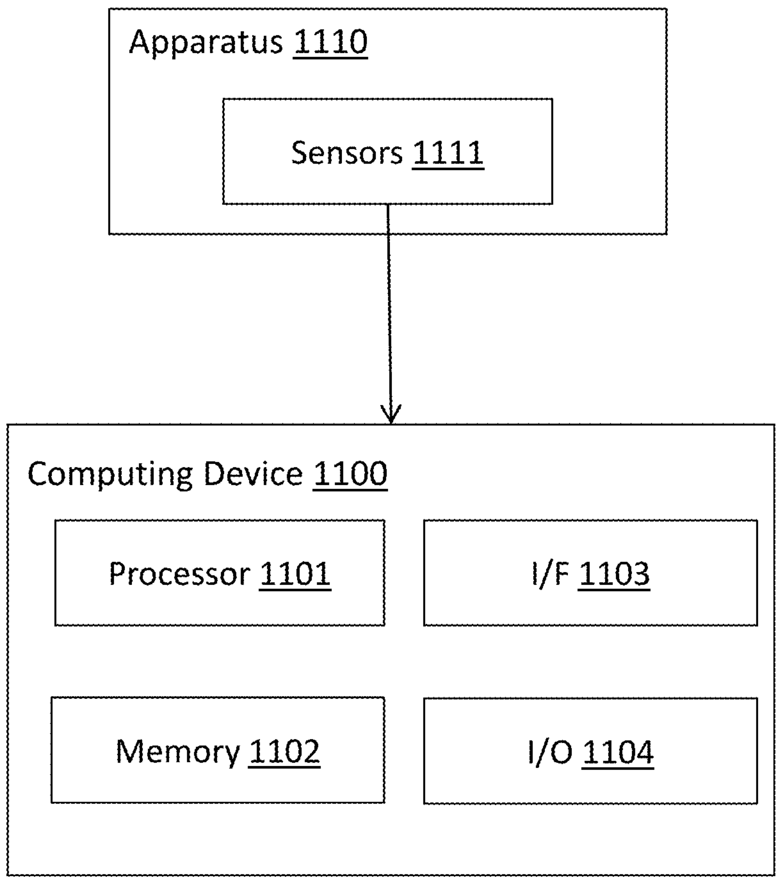
FIG. 11 illustrates an example system diagram upon which example implementations can be implemented.

FIG. 11 illustrates an example system diagram upon which example implementations can be implemented. In this example, there is a computing device 1100 communicatively coupled to a plurality of sensors 1111 of an apparatus 1110. The apparatus 1110 can be a piece of equipment that is undergoing analysis through the plurality of sensors 1111. The sensors can be individual sensors placed within the apparatus 1110, or can be an array of sensors coupled to the apparatus 1110, or can be implemented in other ways in accordance with a desired implementation. In the example depicted of FIG. 11, the apparatus 1110 is depicted as external from the computing device 1100, however other implementations are also possible. For example, the computing device 1100 can be implemented within the apparatus 1110 and be configured to provide the results to an external server.

Computing device 1100 may include processor 1101, memory 1102, network interface (I/F) 1103 and input/output (I/O) interface 1104. Processor 1101 is configured to load one or more programs from memory 1102 and execute them to facilitate the functionality as described in FIGS. 1, 2(*a*)-2(*d*) 5, 6, and 8. Memory 1102 may also be configured to store historical sensor data of the apparatus 1110, which can be retrieved from an external database or from storage devices within the computing device 1100.

Processor 1101 is configured to derive an ideal density function for a first key performance indicator (KPI) value of the apparatus, based on the historical sensor data of the apparatus 1110, and derive a first model relating a first KPI value to a load of the apparatus 1110 based on the historical sensor data of the apparatus 1110 as illustrated, for example, of FIG. 6. For the apparatus 1110 providing sensor data to the computing device 1100, the processor 1101 can be configured to derive a second KPI value from the sensor data of the apparatus 1110 corresponding to the first KPI value; normalize the second KPI value based on the first model and a present load to the apparatus 1110; and derive a density function on the normalized second KPI value as illustrated in FIGS. 6 and 8. When a cumulative probability of the second KPI value falling above a threshold value determined based on the ideal density function of the first KPI, the processor 1101 can be configured to provide a maintenance alert based on the threshold value. In this example implementation, the maintenance alert is utilized to alert based on detected levels of degradation. Further, in this example the first model can be the ideal performance model of the apparatus 1110 as related to the load on the apparatus. Thus, the ideal density function, configured to provide indication of the first ideal KPI values from the historical sensor data, can be normalized with related to load. The normalized ideal density function results can then be compared to a density function for the second current KPI values of the apparatus that is normalized to the load of the apparatus to provide an indication of how the present KPI values of the apparatus 1110 differs from the ideal KPI values. Further, normalizing the second KPI value can be conducted based on the first model and a present load to the apparatus 1110 can involve adjusting the second KPI value based on a value provided from the first model for the present load to the apparatus 1110.

Processor 1101 is also configured to derive one or more threshold frequencies from one or more cumulative probabilities of the ideal density function, each of the one or more cumulative probabilities associated with the first KPI value, wherein each of the one or more cumulative probabilities is associated with level for the maintenance alert, as illustrated for example in FIGS. 7 and 9. Each of the levels of maintenance alert can be defined by a user based on the desired threshold according to the cumulative probabilities.

Processor 1101 can be configured to derive the ideal density function and derive the density function for time periods of an operation mode of the apparatus 1100. Processor 1101 is configured to detect the operation mode by a flow as described, for example, in FIG. 2(*c*), which can include providing a condition value associated with sensor data indicative of the operation mode; calculating a first mean of values for a set of variables correlated with the variable of the operation mode condition specified by the domain expert that meet or exceed the condition value; calculating a second mean of values for the set of variables correlated with variable of the operation mode condition that are below the condition value; determining a mixture model having a first component utilizing the first mean and a second component utilizing the second mean; calculating a decision boundary value between the two components of the mixture; and utilizing the decision boundary value as a threshold for the sensor data as being in the operation mode.

Processor 1101 can also be configured to derive an ideal density function for the plurality of component KPI values; and derive the first model for each of the plurality of component KPI values. Processor 1101 is configured to derive the first model for each of the plurality of component KPI values. The second KPI value can be a composite of the plurality of component KPI values, and the processor 1101 can be configured to derive the second KPI value for a corresponding each of the plurality of component KPI values, and normalize the second KPI value for a corresponding KPI value of the plurality of component KPI values. In this example implementation, KPI values can be an aggregate score of degradation made up of component KPI values, wherein each component KPI value can correspond to an aspect or component of the apparatus 1110. For example, a component KPI value can correspond to an individual sensor monitoring a specific component of the apparatus 1110.

Processor 1101 is also configured to, for a cumulative probability of a component value of the second KPI value falling above a threshold value determined based on the ideal density function of the first KPI, provide a maintenance alert based on the threshold value. Thus, when the cumulative probability of a component KPI value is indicative of degradation beyond the desired threshold when compared to the ideal KPI value, then an alert can be issued corresponding to the component.

Processor 1101 can also be configured to determine a first function configured to estimate KPI values for corresponding load values based on KPI values over time periods of the apparatus being in an operation mode; and configure the first model to normalize a provided KPI value to the load of the apparatus 1110 based on values provided from the first function for the load to the apparatus 1110 in accordance with the FIGS. 2(*a*) and 3.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application will be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

What is claimed is:

1. A method comprising:

deriving an ideal density function for a first key performance indicator (KPI) value of an apparatus, based on historical sensor data of the apparatus;

deriving a first model relating a first KPI value to a load of the apparatus based on the historical sensor data of the apparatus;

for the apparatus providing sensor data:

deriving a second KPI value from the sensor data of the apparatus corresponding to the first KPI value;

normalizing the second KPI value based on the first model and a present load to the apparatus;

deriving a density function on the normalized second KPI value; and for a cumulative probability of the second KPI value falling above a threshold value determined based on the ideal density function of the first KPI, providing a maintenance alert based on the threshold value;

wherein the deriving the ideal density function and the deriving the density function is conducted for data extracted from the historical sensor data and the sensor data during time periods indicative of an operation mode of the apparatus, the detection of the operation mode of the apparatus comprising:

providing a condition value associated with the sensor data indicative of the operation mode;

calculating a first mean of values for a set of variables correlated with a variable of an original operation condition that meet or exceed the condition value;

calculating a second mean of values for the set of variables correlated with the variable of the original operation condition that are below the condition value;

determining a mixture model having a first component utilizing the first mean and a second component utilizing the second mean;

calculating a decision boundary for the mixture model based on separation between the operation mode and the off mode; and utilizing the decision boundary value as a threshold for the operation mode, the decision boundary having the highest separation between the operation mode and the off mode, the utilizing the decision boundary value as the threshold for the operation mode comprising, for the apparatus providing sensor data, marking the received sensor data as stable or non-stable based on the decision boundary value and filtering out the sensor data marked as non-stable for the deriving of the second KPI value.

2. The method of claim 1, further comprising deriving one or more threshold values from one or more cumulative probabilities of the ideal density function, each of the one or more cumulative probabilities associated with the first KPI value, wherein each of the one or more cumulative probabilities is associated with a level for the maintenance alert.

3. The method of claim 1, wherein the first KPI value is a composite of a plurality of component KPI values, wherein the deriving an ideal density function is conducted for the plurality of component KPI values;

wherein the deriving the first model is conducted for each of the plurality of component KPI values;

wherein the second KPI value is a composite of the plurality of component KPI values, wherein the deriving the second KPI value is conducted for a corresponding each of the plurality of component KPI values;

wherein the normalizing the second KPI value is conducted for a corresponding each of the plurality of component KPI values.

4. The method of claim 3, wherein for any one of the plurality of component KPI values associated with the second KPI value in the density function having a cumulative probability above a threshold value of a corresponding one of the plurality of component KPI values associated with the first KPI value in the ideal density function, provide the maintenance alert based on the threshold value.

5. The method of claim 1, wherein the deriving the first model comprises:

determining a first function configured to estimate KPI values for corresponding load values based on KPI values over time periods of the apparatus being in an operation mode; and configuring the first model to normalize a provided KPI value to the load of the apparatus based on values provided from the first function for the load to the apparatus.

6. The method of claim 5, wherein the normalizing the second KPI value based on the first model and a present load to the apparatus comprises adjusting the second KPI value based on a value provided from the first model for the present load to the apparatus.

7. A non-transitory computer readable medium storing instructions for executing a process, the instructions comprising:

deriving an ideal density function for a first key performance indicator (KPI) value of an apparatus, based on historical sensor data of the apparatus;

deriving a first model relating a first KPI value to a load of the apparatus based on the historical sensor data of the apparatus;

for the apparatus providing sensor data:

deriving a second KPI value from the sensor data of the apparatus corresponding to the first KPI value;

normalizing the second KPI value based on the first model and a present load to the apparatus;

deriving a density function on the normalized second KPI value; and for a cumulative probability of the second KPI value falling above a threshold value determined based on the ideal density function of the first KPI, providing a maintenance alert based on the threshold value;

wherein the deriving the ideal density function and the deriving the density function is conducted for data extracted from the historical sensor data and the sensor data during time periods indicative of an operation mode of the apparatus, the detection of the operation mode of the apparatus comprising:

providing a condition value associated with the sensor data indicative of the operation mode;

calculating a first mean of values for a set of variables correlated with a variable of an original operation condition that meet or exceed the condition value;

calculating a second mean of values for the set of variables correlated with the variable of the original operation condition that are below the condition value;

determining a mixture model having a first component utilizing the first mean and a second component utilizing the second mean;

calculating a decision boundary for the mixture model based on separation between the operation mode and the off mode; and utilizing the decision boundary value as a threshold for the operation mode, the decision boundary having the highest separation between the operation mode and the off mode, the utilizing the decision boundary value as the threshold for the operation mode comprising, for the apparatus providing sensor data, marking the received sensor data as stable or non-stable based on the decision boundary value and filtering out the sensor data marked as non-stable for the deriving of the second KPI value.

8. The non-transitory computer readable medium of claim 7, the instructions further comprising deriving one or more threshold values from one or more cumulative probabilities of the ideal density function, each of the one or more cumulative probabilities associated with the first KPI value, wherein each of the one or more cumulative probabilities is associated with a level for the maintenance alert.

9. The non-transitory computer readable medium of claim 7, wherein the first KPI value is a composite of a plurality of component KPI values, wherein the deriving an ideal density function is conducted for the plurality of component KPI values;

wherein the deriving the first model is conducted for each of the plurality of component KPI values;

wherein the second KPI value is a composite of the plurality of component KPI values, wherein the deriving the second KPI value is conducted for a corresponding each of the plurality of component KPI values;

wherein the normalizing the second KPI value is conducted for a corresponding each of the plurality of component KPI values.

10. The non-transitory computer readable medium of claim 9, wherein for any one of the plurality of component KPI values associated with the second KPI value in the density function having a cumulative probability above a threshold value of a corresponding one of the plurality of component KPI values associated with the first KPI value in the ideal density function, provide the maintenance alert based on the threshold value.

11. The non-transitory computer readable medium of claim 7, wherein the deriving the first model comprises:

determining a first function configured to estimate KPI values for corresponding load values based on KPI values over time periods of the apparatus being in an operation mode; and configuring the first model to normalize a provided KPI value to the load of the apparatus based on values provided from the first function for the load to the apparatus.

12. The non-transitory computer readable medium of claim 11, wherein the normalizing the second KPI value based on the first model and a present load to the apparatus comprises adjusting the second KPI value based on a value provided from the first model for the present load to the apparatus.

13. A computing device, comprising:

a processor, configured to:

derive an ideal density function for a first key performance indicator (KPI) value of an apparatus, based on historical sensor data of the apparatus;

derive a first model relating a first KPI value to a load of the apparatus based on the historical sensor data of the apparatus;

for the apparatus providing sensor data:

derive a second KPI value from the sensor data of the apparatus corresponding to the first KPI value;

normalize the second KPI value based on the first model and a present load to the apparatus;

derive a density function on the normalized second KPI value; and for a cumulative probability of the second KPI value falling above a threshold value determined based on the ideal density function of the first KPI, provide a maintenance alert based on the threshold value;

wherein processor is configured to conduct the deriving the ideal density function and the deriving the density function for data extracted from the historical sensor data and the sensor data during time periods indicative of an operation mode of the apparatus, the processor configured to conduct the detection of the operation mode of the apparatus by:

providing a condition value associated with the sensor data indicative of the operation mode;

calculating a first mean of values for a set of variables correlated with a variable of an original operation condition that meet or exceed the condition value;

calculating a second mean of values for the set of variables correlated with the variable of the original operation condition that are below the condition value;

determining a mixture model having a first component utilizing the first mean and a second component utilizing the second mean;

calculating a decision boundary for the mixture model based on separation between the operation mode and the off mode; and utilizing the decision boundary value as a threshold for the operation mode, the decision boundary having the highest separation between the operation mode and the off mode, the utilizing the decision boundary value as the threshold for the operation mode comprising, for the apparatus providing sensor data, marking the received sensor data as stable or non-stable based on the decision boundary value and filtering out the sensor data marked as non-stable for the deriving of the second KPI value.

14. The computing device of claim 13, wherein the processor is configured to derive one or more threshold values from one or more cumulative probabilities of the ideal density function, each of the one or more cumulative probabilities associated with the first KPI value, wherein each of the one or more cumulative probabilities is associated with a level for the maintenance alert.

15. The computing device of claim 13, wherein the first KPI value is a composite of a plurality of component KPI values, wherein the deriving an ideal density function is conducted for the plurality of component KPI values;

wherein the deriving the first model is conducted for each of the plurality of component KPI values;

wherein the second KPI value is a composite of the plurality of component KPI values, wherein the deriving the second KPI value is conducted for a corresponding each of the plurality of component KPI values;

wherein the normalizing the second KPI value is conducted for a corresponding each of the plurality of component KPI values.

16. The computing device of claim 15 wherein the processor is configured to, for any one of the plurality of component KPI values associated with the second KPI value in the density function having a cumulative probability above a threshold value of a corresponding one of the plurality of component KPI values associated with the first KPI value in the ideal density function, provide the maintenance alert based on the threshold value.

17. The computing device of claim 13, wherein the processor is configured to derive the first model by:

determining a first function configured to estimate KPI values for corresponding load values based on KPI values over time periods of the apparatus being in an operation mode; and configuring the first model to normalize a provided KPI value to the load of the apparatus based on values provided from the first function for the load to the apparatus.

* * * * *